US007195749B2

(12) United States Patent
Cheong et al.

(10) Patent No.: US 7,195,749 B2
(45) Date of Patent: Mar. 27, 2007

(54) CHEMICAL-PRESSURE TAILORING OF LOW-FIELD, ROOM TEMPERATURE MAGNETORESISTANCE IN (CA, SR, BA) $FE_{0.5}MO_{0.5}O_3$

(75) Inventors: Sang-Wook Cheong, Chatham, NJ (US); Bog-Gi Kim, Busan (KR)

(73) Assignee: Rutgers University, Piscataway, NJ (US)

( * ) Notice: Subject to any disclaimer, the term of this patent is extended or adjusted under 35 U.S.C. 154(b) by 460 days.

(21) Appl. No.: 10/240,832

(22) PCT Filed: Apr. 4, 2001

(86) PCT No.: PCT/US01/10929

§ 371 (c)(1),
(2), (4) Date: Mar. 7, 2003

(87) PCT Pub. No.: WO01/77024

PCT Pub. Date: Oct. 18, 2001

(65) Prior Publication Data

US 2004/0057897 A1 Mar. 25, 2004

Related U.S. Application Data

(60) Provisional application No. 60/253,186, filed on Nov. 27, 2000, provisional application No. 60/194,870, filed on Apr. 6, 2000.

(51) Int. Cl.
*C01F 11/00* (2006.01)
*C01G 39/00* (2006.01)
*C01G 49/00* (2006.01)
*G01R 33/00* (2006.01)
*G01R 33/02* (2006.01)

(52) U.S. Cl. .............................. 423/592.1; 423/593.1; 423/594.1; 423/594.2; 423/594.16; 423/606; 423/632; 423/635; 324/252; 324/260

(58) Field of Classification Search ............. 423/592.1, 423/593.1, 594.1, 594.2, 594.16, 606, 632, 423/635; 324/260, 251, 252
See application file for complete search history.

(56) References Cited

U.S. PATENT DOCUMENTS 5,721,654 A 2/1998 Manako et al. ............. 360/110

OTHER PUBLICATIONS

The abstract of the reference "Effect of Ba content on initial magnetization of Sr1-xBaxFeMoO6 and the structural stability under high pressure" by Yu et al., Physical Review B: Condensed Matter and Materials Physics, (2004), 69(21), 214405/1-214405/5.*
The abstract of the reference "Combustion synthesis of the magnetoresistive double perovskite (Ba1.6Sr0.4)FeMoO6" by Douvalis et al., Journal of Applied Physics, (2003), 93(10, Pt. 3), 8071-8073.*
The abstract of the reference "Chemical-pressure tailoring of low-field, room-temperature magnetoresistance in (Ca, Sr, Ba)Fe0.5Mo0.5O3" by Kim et al., Applied Physics Letters, (2001), 79(3), 388-390.*
Zhou, J.P., *Enhancement of room temperature magnetoresistance in double perovskite ferrimagnets*, J. Appl. Phys., 2000, vol. 87 (9, Pt. 2), pp. 5037-5039.
Goodenough, J.B., *Comment on the magnetic properties of the system Sr2-xCaxFeMo6 1<x>2*, Int. J. Inorg. Mater., 2000, 2(1), pp. 3-9.
A. Maignan, et al., Large Intragrainmagnetoresistance Above Room Temperature in the Double Perovskite BA(2)FeMoO(6), Dec. 1999—pp. 224-227, Journal of Solid State Chemistry 144.
R. Xu et al., Large Magnetoresistance in Non-Magnetic Silver Chalcogenides, Nov. 1997, pp. 57-60, Nature (Magazine) Letters to Nature, vol. 390.
C. Ritter, et al., Influence of Oxygen Content on the Structual, Magnetotransport, and Magnetic Properties of LaMnO(3+6), Oct. 1997 - Physical Review—vol. 56, No. 14—pp. 8902-8911.
T.H. Kim, et al., Large Room-Temperature Intergrain Magnetoresistance in Double Perovskite SrFe(1-x)(Mo or Re)(x)O(3), Mar. 1999, Applied Physics Letters—vol. 74, No. 12—pp. 1737-1739.
N. Manyala, Magnoresistance From Quantum Interference Effect in Ferromagnets, Apr. 2000, Nature (Magazine)—vol. 404, pp. 581-584.
A. Chattopadhyay and A.J. Mills, Theory of Transition Temperature of Magnetic Double Perovskites, Publication Jul. 2001, Physical Review B Journal, vol. 64, Issue 2, id. 024424 (PhRvB Homepage), pp. 1-5.
K.I. Kobayashi, et al., Room-Temperaturen Magnetoresistance in an Oxide Material With an Ordered Double-Perovskite Structure, Oct. 1998, Nature (Magazine)—vol. 395—pp. 677-680.
H.Q. Yin, et al., Intra-Versis Intergranular Low-Field Magnetoresistence of Sr(2)FeMoO(6), Nov. 1999, Applied Physics Letters—vol. 75, No. 18, pp. 2812-2814.
C.N.R. Rao, et al., Giant Magnetoresistance and Related Properties of Rare-Earth Manganates and Other Oxide Systems, 1996, Chem. Mater. (American Chemical Society)—vol. 8, No. 10— pp. 2421-2432.
S. Lee, et al., Intergrain Magnetoresistance Via Second-Order Tunneling in Perovskite Manganites, May 1999, The American Physical Society—Physical Review Letters, vol. 82, No. 22—pp. 4508-4511.

(Continued)

*Primary Examiner*—Timothy C. Vanoy
(74) *Attorney, Agent, or Firm*—Duane Morris LLP (57) ABSTRACT

The room temperature, low field intergrain magnetoresistance (IMR) of the double perovsktite $SrFe_{0.5}MO_{0.5}O_3$ is found to be highly tunable by doping either Ca or Ba into the Sr site. The dopant exerts a chemical pressure, changing the Curie temperature and the magnetic softness. The IMR at optimal doping $(Sr_{0.2}Ba_{0.8}Fe_{0.5}Mo_{0.5}O_3)$ is approximately 3.5% in 100 Oe, and increases further in high fields. The unprecedented strength of the IMR in this highly spin polarized system provides new grounds for employing novel magnetic materials for new magnetic sensing applications and spin electronics.

15 Claims, 5 Drawing Sheets

OTHER PUBLICATIONS

P.G. Radaelli and G. Iannone, Structural Effects on the Magnetic and Transport Properties, Oct. 1997, The American Physical Society—Physical eview B—vol. 56, No. 13—pp. 8265-8276.

J. Gopalakrishnan, et al., Metallic and Nonmetallic Double Perovskites: A Case Study, Oct. 2000, Physical Review B Journal (Condensed Matter and Materials Physics), vol. 62, Issue 14, pp. 1-19.

Tineke Thio and S. A. Solin, Giant Magnetoresistance Enhancement in Inhomogeneous Semiconductors, Jun. 1998, American Institute of Physics—Applied Physics Letters—vol. 72, No. 26—pp. 3497-3499.

H. Asano, et al., Pulsed-Laser-Deposited Epitaxial Sr(2)FeMoO(6-y) Thin Films, Jun. 1999, American Institute of Physics—Applied Physics Letters—vol. 74, No. 24—pp. 3696-3698.

N.D. Mathur et al., Large Low-Field Magnetoresistance in La(0.7)Ca(0.3)MnO(3) Induced by Artifical Grain Boundaries, May 1997, Nature (Magazine) Letters to Nature—vol. 387—pp. 266-268.

J.Q. Xiao, et al., Giant Magnetoresistance in Nonmultilayer Magnetic Systems, Jun. 1992, The American Physical Society—Physical Review Letters—vol. 68, No. 25—pp. 3749-3752.

H.Y. Hwang, et al., Lattice Effects on the Magnetoresistance in Doped LaMnO(3), Jul. 1995, The American Physical Society—Physical Review Letters—vol. 75, No. 5, pp. 914-917.

H.Y. Hwang et al., Spin-Polarized Intergrain Tunneling in La(2/3)Sr(1/3)MnO(3), Sep. 1996, The American Physical Society—Physical Review Letters—vol. 77, No. 10—pp. 2041-2044.

* cited by examiner

CHEMICAL-PRESSURE TAILORING OF LOW-FIELD, ROOM TEMPERATURE MAGNETORESISTANCE IN (CA, SR, BA) $FE_{0.5}MO_{0.5}O_3$

This application claims priority of the earlier filing date, under 35 U.S.C. 371, of the PCT International Application No. PCT/US01/10929, filed on Apr. 4, 2001, published in English, which claims the priority of the earlier filing dates of U.S. Provisional Application No. 60/253,186 filed Nov. 27, 2000 and U.S. Provisional Application No. 60/194,870 filed Apr. 6, 2000.

FIELD OF THE INVENTION

This invention relates to magnetic material systems, and more particularly to double perovskite material systems having large magnitude room temperature IRs.

BACKGROUND OF THE INVENTION

The impending ability to manipulate electron spins using emerging technology and the need for ever-increasing magnetic storage density have driven researchers to search for novel ferromagnetic materials other than Fe, Co, Ni and their alloys. Remarkable phenomena, such as colossal magnetoresistance (CMR) and quantum-interference magnetoresistance have been discovered in these new materials. Unfortunately, most of these effects are only realized at low temperatures and in high magnetic fields, making potential applications impractical. For example, perovskite (or pyrochlore) manganites and related compounds exhibit CMR in the vicinity of the metal-insulator transition temperature. However, this only occurs below room temperature and under applied fields of several tesla.

Other novel materials, such as silver chalcogenides ($Ag_{2+\delta}Se$, $Ag_{2+\delta}Te$), $CrO_2$, doped iron silicide ($Fe_{1-x}Co_xSi$, $Fe_{1-x}Mn_xSi$), and inhomogeneous semiconductors such as $Hg_{1-x}Cd_xTe$, also exhibit significant magnetoresistance (MR) only at low temperatures and/or in high fields. One interesting approach to reduce the field strength required to observe a large MR is to utilize tunneling MR (TMR) in either multilayer structures or granular (polycrystalline) materials.

Intergrain magnetoresistance (IMR) originates from the change of grain-to-grain electron tunneling in polycrystalline materials under applied magnetic fields. This effect becomes significant in materials where the spins of the itinerant electrons are highly polarized. In the so-called half metals, the carrier spins are completely polarized. These systems exhibit metallic transport behavior for one spin orientation and insulating behavior for the other. However, significant IMR only occurs below the Curie temperature ($T_c$), and thus room temperature IMR does not exist in $Tl_2Mn_2O_7$ ($T_c \approx 120°$ K.) and is nearly absent in perovskite manganites and $CrO_2$.

Recent interest has been focused on the double perovskite material systems such as $SrFe_{0.5}Mo_{0.5}O_3$, due to the large magnitude of the room temperature IMR. $SrFe_{0.5}Mo_{0.5}O_3$ has an IMR of about 5% at room temperature in magnetic fields of about 10 kOe. The large fields required to achieve this level of IMR probably originate from the high saturation field in this material, and seriously limit the technological applications. For example, the field strength required for magnetic heads is in the range of a few hundred Oe. It is common practice to control magnetic softness by adjusting the magneto-elastic coupling through alloying. For example, the alloying of Ni with Fe significantly lowers the coercive and saturation fields. Furthermore, it has been well established that the substitution of different-size ions into the A-site of $AMnO_3$ exerts a "chemical pressure" on the system. This chemical pressure causes pronounced changes in physical properties of the system such as $T_C$ and CMR.

Accordingly, it would be desirable to reduce the magnetic fields required for achieving the large magnitude room temperature IMRs in double perovskite material systems.

SUMMARY OF THE INVENTION

In accordance with a first aspect of the present invention, a magnetoresistive material system and a magnetic field sensing device made from same comprises $Sr_{1-x}Ba_xFe_{0.5}Mo_{0.5}O_3$, wherein x is about 0.1 to about 1.0. When x is about 0.8, the first embodiment of the material system exhibits a magnetoresistance change of about 3.5 percent in a magnetic field of about 100 Oe at room temperature, and a magnetoresistance change of about 11 percent in a magnetic field of about 10 kOe at room temperature.

In accordance with a second aspect of the present invention, a magnetoresistive material system and a magnetic field sensing device made from same comprises $Sr_{1-x}Ca_xFe_{0.5}Mo_{0.5}O_3$, wherein x is about 0.01 to about 0.1. When x is about 0.05, the second embodiment of the material system exhibits a magnetoresistance change of about 11 percent in a magnetic field of about 10 kOe at room temperature.

DETAILED DESCRIPTION OF THE INVENTION

The present invention is directed to magnetoresistive, Fe—Mo double perovskite material systems, specifically (Ca, Sr, Ba)$Fe_{0.5}Mo_{0.5}O_3$ material systems having chemical pressure tuned $T_C$s and the room temperature IMRs. In the discussion which follows, the formula $Fe_{0.5}Mo_{0.5}O_3$ will be denoted as FMO.

A first embodiment of the material system of the present invention comprises $Sr_{1-x}Ba_xFMO$, where x is about 0.1 to about 1.0. The preferred composition of this system, $Sr_{0.2}Ba_{0.8}FMO$, exhibits a significantly enhanced low-field (100 Oe range) IMR, which is associated with soft magnetic behaviors. In particular, polycrystalline $Sr_{0.2}Ba_{0.8}FMO$ exhibits an unprecedented IMR value of approximately 3.5% in 100 Oe at room temperature, which increases to 8% in 1 kOe. This large low-field IMR accompanies a negligible field hysteresis, which is consistent with the small coercive field (less than 10 Oe) of this material.

A second embodiment of the material system of the present invention comprises $Sr_{1-x}Ca_xFe_{0.5}Mo_{0.5}O_3$, where x is about 0.01 to about 0.1. IMR in the field range of a few kOe is optimized at the preferred composition of $Sr_{0.95}Ca_{0.05}FMO$, which is associated with an enhanced ferrimagnetic transition temperature.

Figure 5:
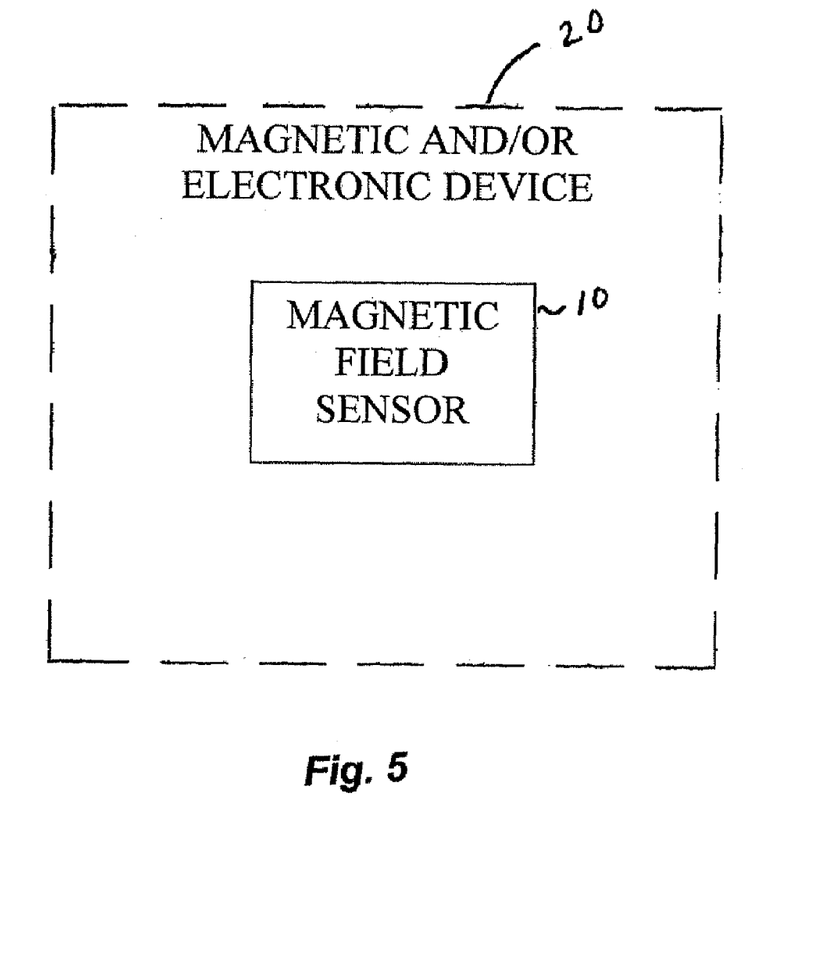
FIG. 5 is a schematic representation of an exemplary device made according to the principles of the present invention.

The double perovskite material systems of the present invention are intended for use in magnetic and electronic technologies. More specifically, as shown in FIG. 5, the double perovskite material systems of the present invention may be used for constructing a magnetic field sensor 10 utilized in a magnetic and/or electronic device 20 including, but not limited to, a magnetic read head for a hard disk, a speed sensor, and a gauss meter. Further the double perovskite material systems of the present invention may also be useful in other devices and applications which utilize magnetic field sensing elements.

Exemplary Sample Preparations and Experimental Test Results

A series of polycrystalline $Sr_{1-x}Ca_xFMO$ and $Sr_{1-y}Ba_y$-FMO samples were prepared by standard solid-state reaction under a 2% $H_2/N_2$ atmosphere. The samples were analyzed using X-ray diffraction by means of Rigaku D-max . The X-ray diffraction data demonstrated that the samples were single phase. Superlattice peaks indicating Fe—Mo ordering were also observed. The MR of the samples in fields up to 10 kOe was measured at room temperature using a conventional four-probe technique in the longitudinal geometry. Magnetization was measured by a Quantum Design SQUID magnetometer, and $T_C$ was precisely determined from AC susceptibility measurements (about 1 Oe) taken above 300 K.

Figure 1A:
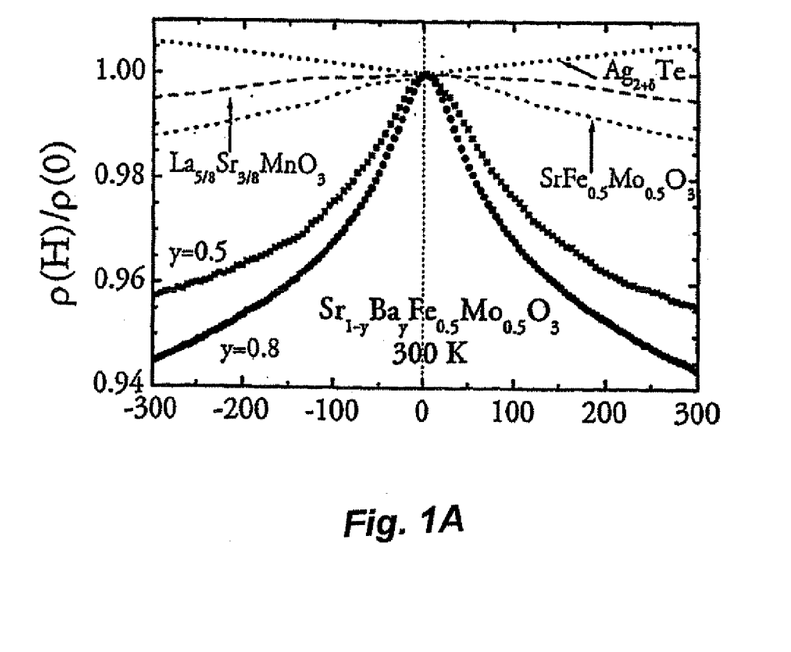
FIG. 1A is a graph showing normalized resistivity versus magnetic field at room temperature in $Sr_{1-y}Ba_yFe_{0.5}Mo_{0.5}O_3$ and other materials.
Figure 4A:
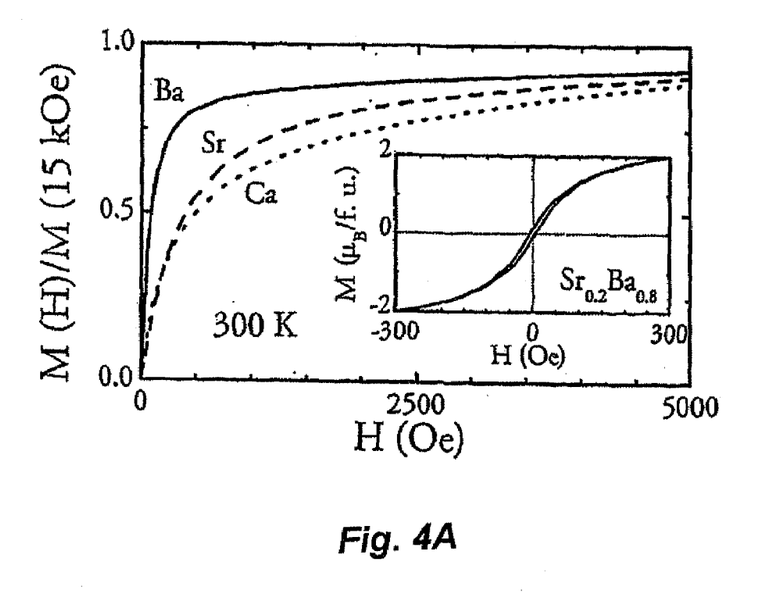
FIG. 4A is a graph showing normalized magnetization as a function of magnetic field for $BaFe_{0.5}Mo_{0.5}O_3$, $SrFe_{0.5}Mo_{0.5}O_3$, and $CaFe_{0.5}Mo_{0.5}O_3$; with the magnetic hysteresis loop of $Sr_{0.2}Ba_{0.8}Fe_{0.5}Mo_{0.5}O_3$ shown in inset.

Optimal low-field IMR was observed in $Sr_{0.2}Ba_{0.8}FMO$. FIG. 1A is graph showing normalized resistivity versus magnetic field at room temperature in $Sr_{1-y}Ba_yFe_{0.5}Mo_{0.5}O_3$ and the other materials, where y equals 0.8 (depicted with circles) and y equals 0.5 (depicted with squares). As shown, the low-field MR in the material systems of the present invention are much larger than in prior art material systems. The CMR manganite $(La_{5/8}Sr_{3/8}MnO_3)$ and SrFMO show less than 1% negative MR in 300 Oe, and silver telluride exhibits about 0.5% positive MR in 300 Oe. The $Sr_{0.2}Ba_{0.8}FMO$ sample of the present invention shows 2% MR in 50 Oe, 3.5% MR in 100 Oe, and 5.7% MR in 300 Oe. The $Sr_{0.5}Ba_{0.5}FMO$ sample shows slightly reduced MR. No measurable field hysteresis is associated with the MR of the $Sr_{1-y}Ba_yFe_{0.5}Mo_{0.5}O_3$ materials of the present invention. The magnetization measurement shows the coercive field of this material system to be less than 10 Oe (FIG. 4A inset). Note that to minimize the demagnetization factor, needle-shaped samples were measured with the field along the longitudinal direction of the samples. However, voids in the polycrystalline samples can contribute to the demagnetization factor. Therefore, low-field MR should be larger in polycrystalline thin films made in accordance with the present invention.

Figure 1B:
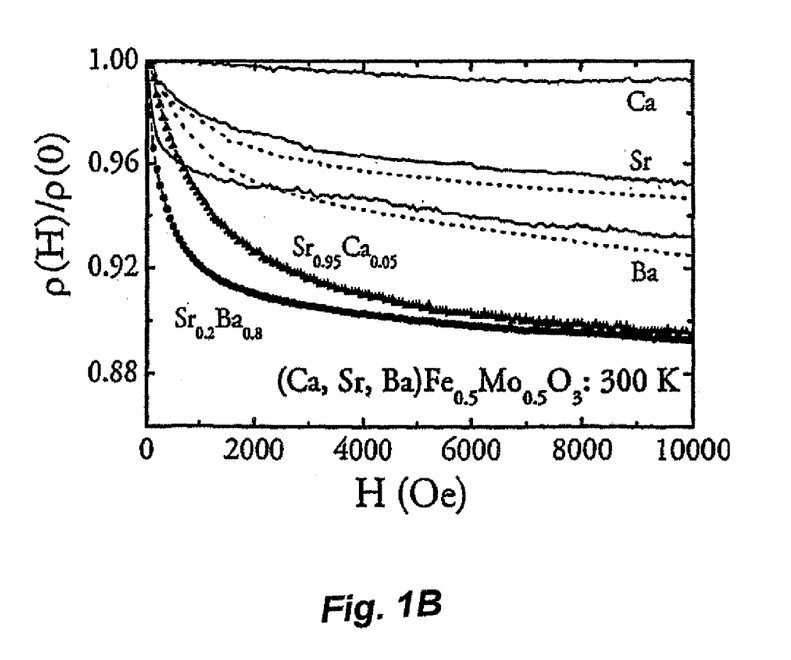
FIG. 1B is a graph showing normalized resistivity versus magnetic field up to 10 kOe in $Sr_{0.2}Ba_{0.8}Fe_{0.5}Mo_{0.5}O_3$ and $Sr_{0.95}Ca_{0.05}Fe_{0.5}Mo_{0.5}O_3$.

FIG. 1B is a graph showing the room temperature MR of various compositions of (Ca,Sr,Ba)FMO measured in fields up to 10 kOe (depicted with solid lines). For comparison, MR values reported for prior art SrFMO and BaFMO were included (depicted with dashed lines). The MR of CaFMO was small (~1% in 10 kOe) compared with that of SrFMO and BaFMO (~5–6% in 10 kOe). The values of the 10 kOe MR are comparable to those in the prior art. However, the MR response of the Ba sample of the present invention to small magnetic fields (<1 kOe) was more dramatic than the MR response of the prior art samples. $Sr_{0.95}Ca_{0.05}FMO$ (depicted with triangles) and $Sr_{0.2}Ba_{0.8}FMO$ (depicted with circles) appear to be optimum compositions with respect to MR. In the $Sr_{1-x}Ca_xFMO$ series, $Sr_{0.95}Ca_{0.05}FMO$ is the optimal composition, showing approximately 11% MR in 10 kOe. In the $Sr_{1-y}Ba_yFMO$ series, MR (about 11% MR in 10 kOe) is optimized in the composition of $Sr_{0.2}Ba_{0.8}FMO$.

Figure 2:
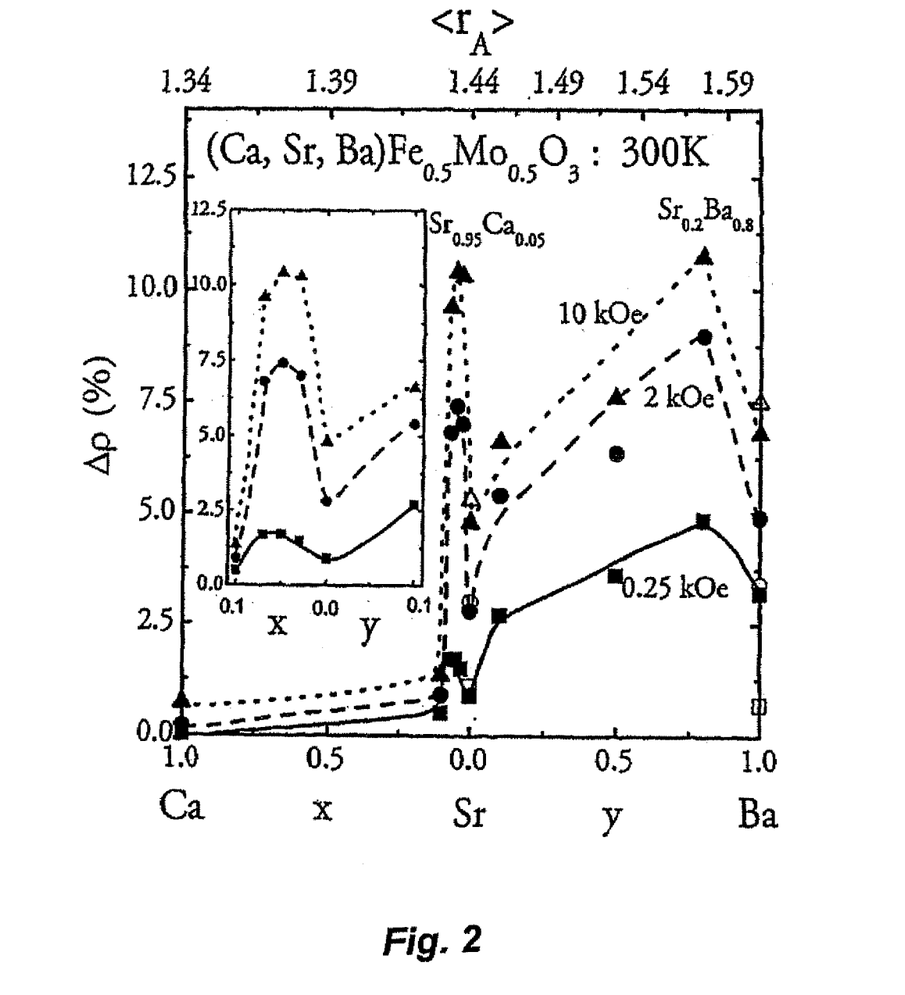
FIG. 2 is a graph showing change of resistivity as a function of Ca (x) or Ba (y) concentration in three magnetic fields: 0.25 kOe (square), 2 kOe (circle) and 10 kOe (triangle)

IMR varies non-monotonically with the variation of chemical pressure, which increases with decreasing ionic size. FIG. 2 shows the change of MR as a function of composition (i.e. average ionic size) in three different fields: 0.25 kOe (depicted with squares), 2 kOe (depicted with circles), and 10 kOe (depicted with triangles). Prior art values for SrFMO and BaFMO are also shown for comparison. Solid symbols represent the results from the present invention, and open symbols represent results from the prior art, respectively. Lines are drawn as guides for the eye. The MR of SrFMO is consistent with the prior art for all fields studied. However, in the case of BaFMO, the observed MR in 0.25 kOe is much larger than the prior art value even though the MR in 10 kOe is similar to that in the prior art. The, $Sr_{0.2}Ba_{0.8}FMO$ sample of the present invention exhibited the largest MR (5%) at 0.25 kOe. A common feature of the $Sr_{1-y}Ba_yFMO$ series is this enhancement of the low-field MR, which can clearly be seen in the 0.25 kOe data. The MR (especially, at 10 kOe) of the $Sr_{1-x}Ca_xFMO$ series is sharply maximized at x=0.05. Even though this feature persists down to low fields, the low-field MR of $Sr_{0.95}Ca_{0.05}FMO$ is relatively small, compared to that of the $Sr_{1-y}Ba_yFMO$ series. This remarkable enhancement of high-field MR disappears rapidly with further doping of Ca (FIG. 2, inset). Hence, the MR behavior shows two important features: 1) drastic enhancement of low-field MR in the Ba doping region with the optimization of low-field MR at $Sr_{0.2}Ba_{0.8}FMO$, and 2) enhanced MR at ~5% Ca doping ($Sr_{0.95}Ca_{0.05}FMO$) for high fields with an abrupt drop of the MR at ~10% Ca doping.

Figure 3:
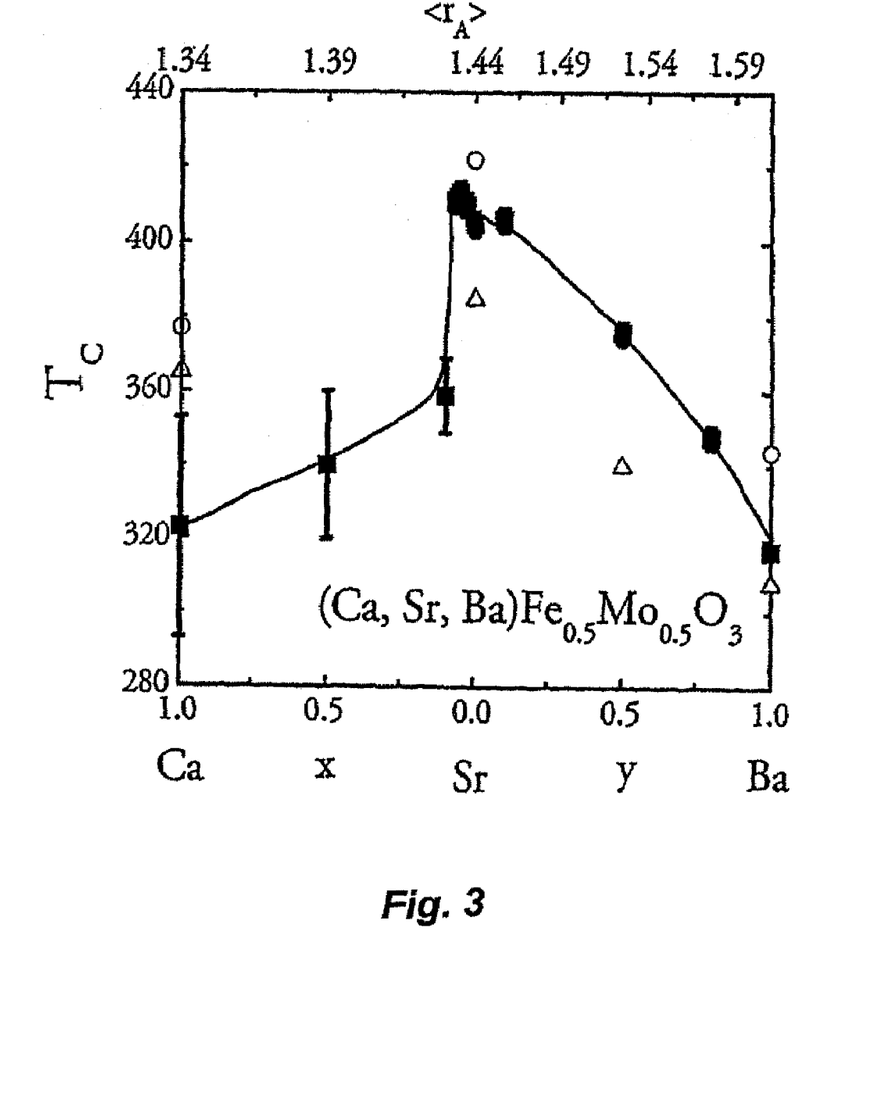
FIG. 3 is a magnetic phase diagram plotting $T_C$ as a function of Ca (x) or Ba (y) concentration.

In order to understand this non-monotonic MR behavior, reference should now be made to FIG. 3 which shows a magnetic phase diagram based on alternating current (AC) susceptibility, $\chi$, as a function of temperature comparing the material system of the present invention with prior art values. Solid symbols represent the samples of the present invention and open symbols (depicted with circles and triangles) represent the prior art. For the end members, there exists a slight discrepancy between $T_C$ in the samples of the present invention and in the prior art, which might reflect a slight variation of stoichiometry. The $T_C$ for the $Sr_{1-y}Ba_y$-FMO samples of the present invention tends to decrease monotonically from 404 K. (y=0) to 318 degrees K. (y=1) with increasing Ba concentration. For the $Sr_{1-x}Ca_xFMO$ samples of the present invention, there exists a slow increase of $T_C$ as x increases, which is followed by a sharp drop of $T_C$ when x reaches 0.07–0.1. For x larger than 0.1 $T_C$ decreases monotonically to that of the Ca end member.

FIG. 4A shows the normalized magnetization of three different samples at room temperature, and the inset of FIG. 4A depicts the hysteresis loop for $Sr_{0.2}Ba_{0.8}FMO$. The rapid rise of the low-field magnetization of the BaFMO sample (depicted with a solid line), compared with that of the CaFMO sample (depicted with a short dashed line) and the SrFMO (depicted with a dashed line) sample, indicates that the BaFMO is magnetically soft. The magnetization of the BaFMO in 0.25 kOe is more than 60% of the 15 kOe magnetization value. It was generally found that Ba-doped samples are magnetically softer than Ca-doped samples. For example, the magnetization of the Ca-doped samples in 0.25 kOe is about 45% of the 15 kOe magnetization value. This magnetic softness is also evident in the AC susceptibility data. The AC susceptibility of the Ba-doped samples is about three times larger than that of the Ca-doped samples.

Figure 4B:
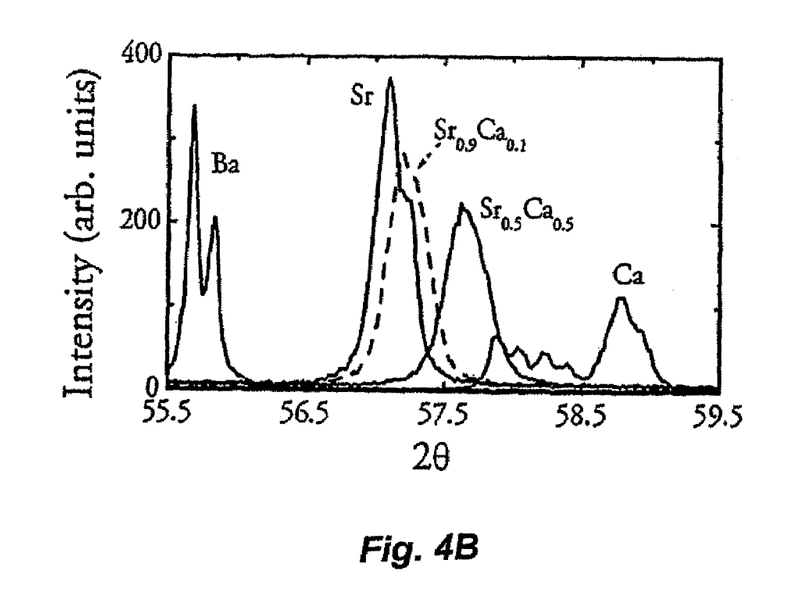
FIG. 4B is a graph showing x-ray diffraction intensity versus $2\theta$ for $BaFe_{0.5}Mo_{0.5}O_3$, $SrFe_{0.5}Mo_{0.05}O_3$, $CaFe_{0.5}Mo_{0.5}O_3$, and $Sr_{1-x}Ca_xFe_{0.5}Mo_{0.5}O_3$.

FIG. 4B show x-ray results that reveal an intriguing structural evolution with chemical pressure. First of all, the (quasi-) cubic perovskite x-ray pattern with $K\alpha 1$ and $K\alpha 2$ splitting is consistent with those of BaFMO and SrFMO. However, the CaFMO pattern shows clear monoclinic splitting, indicating significant structural distortions in the Ca compound. No drastic change of the x-ray pattern was observed in $Sr_{1-x}Ca_xFMO$ with Ca doping up to x=0.05, but peak broadening was evident for Ca concentrations beyond x≈0.07. This x-ray peak broadening indicates that the average structure is close to that of a (quasi-) cubic perovskite, but there exist local incoherent structural distortions in the Ca-doped materials with x=0.1–0.5.

The evolution of $T_C$ in (Ca,Sr,Ba)FMO with chemical pressure can be understood in terms of crystallographic change and the consequent change in the electron hopping. In the ordered Fe—Mo double perovskites, AFMO, the B site ions order in the NaCl structure due to their charge and size differences, and thus each Fe—O octahedron is surrounded by six Mo—O octahedra, and vice versa. A simple ionic consideration shows that the valence of Fe is 3+($3d^5$, S=5/2) and that of Mo is 5+($4d^1$, S=1/2). Mo $t_{2g}$ electrons are supposed to be itinerant, and thus two hopping mechanisms need to be considered: the double-exchange-like hopping in Mo—O—Fe and the direct Mo—Mo hopping. Chemical pressure can influence the electron hopping (i.e., electron band width (W)) through the change of structural parameters such as the bond lengths and bond angles of Mo—O—Fe and Mo—Mo. X-ray results indicate that by changing the composition from BaFMO to $Sr_{0.95}Ca_{0.05}FMO$ (i.e., increasing chemical pressure), the structure remains as (quasi-) cubic, and Mo—O—Fe, and Mo—Mo bond angles do not change much (they remain as about 180°). However, Mo—O—Fe and Mo—Mo bond lengths decrease, and thus W increases with increasing chemical pressure, which is consistent with the enhancement of $T_C$. On the other hand, upon further increasing chemical pressure from $Sr_{0.95}Ca_{0.05}FMO$ to CaFMO, the structure changes from (quasi-) cubic to monoclinic, which ought to influence not only bond distances but also bond angles significantly. Thus, electron hopping can be reduced in monoclinic CaFMO, which is in accordance with the decreased $T_C$ in the CaFMO. Consistently, the abrupt decrease of $T_C$ near $Sr_{0.9}Ca_{0.1}FMO$ occurs at the composition where x-ray peak broadening occurs, indicating local structural distortions. It is emphasize that, compared to $e_g$ orbitals in manganites, the relevant orbital hopping path for Fe—O—Mo is $t_{2g}$-$p_\pi$-$t_{2g}$ so that the chemical pressure effect on $T_C$ is expected to be much smaller than that of the manganites due to their bonding geometry. However, the direct hopping between diagonal Mo ions is presumably sensitive to structural parameters, especially the bond angle.

The intriguing evolution of MR behavior with chemical pressure (FIG. 2) can be qualitatively understood from the concomitant change of $T_C$ (FIG. 3) and magnetic softness (FIG. 4A). In general, the system of the present invention becomes magnetically softer with increasing Ba concentration, and BaFMO shows a rapid rise of the magnetization with increasing magnetic field (FIG. 4A). Even though x-ray results indicate that the structure is always (quasi-) cubic for the Sr—Ba system, the detailed crystallographic study has shown that there exists a slight tetragonal distortion in the Sr system, and the Ba system is simple cubic. Thus, when the structure approaches simple cubic with Ba doping, the magneto-elastic coupling should be reduced, and consequently the system becomes magnetically soft. Evidently, the low-field IMR can be enhanced when the system becomes magnetically soft. However, $T_C$ decreases with increasing Ba concentration. These two competing effects optimize low-field, room temperature IMR at the composition of $Sr_{0.2}Ba_{0.8}FMO$. IMR in fields of a few kOe is more sensitive to $T_C$ than magnetic softness. Thus, $Sr_{0.95}Ca_{0.05}FMO$, optimized with respect to $T_C$, results in maximal IMR infields of a few kOe.

While the foregoing invention has been described with reference to the above embodiments, various modifications and changes can be made without departing from the spirit of the invention. Accordingly, such modifications and changes are considered to be within the scope of the appended claims.

What is claimed is:

1. A magnetoresistive material comprising $Sr_{1-x}Ba_xFe_{0.5}Mo_{0.5}O_3$, wherein x is about 0.1 to about 1.0.

2. The material system according to claim 1, wherein x is about 0.8.

3. The material system according to claim 2, wherein the material system exhibits a magnetoresistance change of about 3.5 percent in a magnetic field of about 100 Oe at room temperature.

4. The material system according to claim 2, wherein the material system exhibits a magnetoresistance change of about 11 percent in a magnetic field of about 10 kOe at room temperature.

5. A magnetic field sensing device comprising a $Sr_{1-x}Ba_xFe_{0.5}Mo_{0.5}O_3$, material system, wherein x is about 0.1 to about 1.0.

6. The magnetic field sensing device according to claim 5, wherein x is about 0.8.

7. The magnetic field sensing device according to claim 6, wherein the device exhibits a magnetoresistance change of about 3.5 percent in a magnetic field of about 100 Oe at room temperature.

8. The magnetic field sensing device according to claim 6, wherein the device exhibits a magnetoresistance change of about 11 percent in a magnetic field of about 10 kOe at room temperature.

9. A magnetic field sensing device comprising a $Sr_{1-x}Ca_xFe_{0.5}Mo0.5O_3$, material, wherein x is about 0.01 to about 0.1.

10. The magnetic field sensing device according to claim 9, wherein x is about 0.05.

11. The magnetic field sensing device according to claim 10, wherein the device exhibits a magnetoresistance change of about 11 percent in a magnetic field of about 10 kOe at room temperature.

12. A method of tuning room temperature, low field intergrain magnetoresistance of an $SrFe_{0.5}Mo_{0.5}O_3$ material, the method comprising the step of doping a dopant into the Sr site of the $SrFe_{0.5}Mo_{0.5}O_3$ material, wherein the donant consists essentially of Ba and doping is performed to form an $Sr_{1-x}Ba_xFe_{0.5}Mo_{0.5}O_3$, material, wherein x is about 0.1 to about 1.0.

13. The method according to claim 12, wherein x is about 0.8.

14. The method according to claim 13, wherein the material system exhibits a magnetoresistance change of about 3.5 percent in a magnetic field of about 100 Oe at room temperature.

15. The method according to claim 13, wherein the material system exhibits a magnetoresistance change of about 11 percent in a magnetic field of about 10 kOe at room temperature.

* * * * *